US010276552B2

(12) United States Patent
Hartmann et al.

(10) Patent No.: US 10,276,552 B2
(45) Date of Patent: Apr. 30, 2019

(54) SEMICONDUCTOR MODULE

(71) Applicant: ABB Schweiz AG, Baden (CH)

(72) Inventors: Samuel Hartmann, Staufen (CH);
Ulrich Schlapbach, Liebefeld (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/967,233

(22) Filed: Apr. 30, 2018

(65) Prior Publication Data

US 2018/0247923 A1    Aug. 30, 2018

Related U.S. Application Data

(63) Continuation of application No. PCT/EP2016/074733, filed on Oct. 14, 2016.

(30) Foreign Application Priority Data

Oct. 29, 2015  (EP) .................................... 15192123

(51) Int. Cl.
*H01L 25/18*    (2006.01)
*H01L 25/07*    (2006.01)
(Continued)

(52) U.S. Cl.
CPC ........ *H01L 25/18* (2013.01); *H01L 23/49811* (2013.01); *H01L 23/49838* (2013.01);
(Continued)

(58) Field of Classification Search
CPC . H01L 25/18; H01L 25/072; H01L 23/49811; H01L 23/49838; H01L 23/5381
See application file for complete search history.

(56) References Cited

U.S. PATENT DOCUMENTS 7,763,974 B2    7/2010  Takahasi et al.
9,196,604 B2   11/2015  Tamada et al.
(Continued)

FOREIGN PATENT DOCUMENTS

CN    203553127 U    4/2014
JP    2003142689 A    5/2003
(Continued)

OTHER PUBLICATIONS

European Patent Office, International Search Report & Written Opinion issued in corresponding Application No. PCT/EP2016/074733, dated Jan. 10, 2017, 12 pp.
(Continued)

*Primary Examiner* — Phat X Cao
(74) *Attorney, Agent, or Firm* — J. Bruce Schelkopf; Taft Stettinius & Hollister LLP

(57) ABSTRACT

A semiconductor module, comprises a substrate plate; a semiconductor switch chip and a diode chip attached to a collector conductor on the substrate plate, wherein the diode chip is electrically connected antiparallel to the semiconductor switch chip; wherein the semiconductor switch chip is electrically connected via bond wires to an emitter conductor on the substrate plate providing a first emitter current path, which emitter conductor is arranged oppositely to the semiconductor switch chip with respect to the diode chip; wherein a gate electrode of the semiconductor switch chip is electrically connected via a bond wire to a gate conductor on the substrate plate providing a gate current path, which gate conductor is arranged oppositely to the semiconductor switch chip with respect to the diode chip; and wherein a protruding area of the emitter conductor runs besides the diode chip towards the first semiconductor switch chip and the first semiconductor switch chip is directly connected via a bond wire with the protruding area providing an additional
(Continued)

emitter current path running at least partially along the gate current path. The semiconductor switch chip is a first semiconductor switch chip and the diode chip is a first diode chip, which are arranged in a first row. The semiconductor module comprises further a second row of a second semiconductor switch chip and a second diode chip attached to the collector conductor, wherein the diode chip of each row is electrically connected antiparallel to the semiconductor switch chip of the same row and the first and second rows are electrically connected in parallel. The first semiconductor switch chip is arranged besides the second diode chip and the second semiconductor chip is arranged besides the first diode chip.

21 Claims, 5 Drawing Sheets

(51) Int. Cl.
*H01L 23/00* (2006.01)
*H01L 23/498* (2006.01)
*H01L 23/538* (2006.01)

(52) U.S. Cl.
CPC .......... *H01L 23/5381* (2013.01); *H01L 24/48* (2013.01); *H01L 24/49* (2013.01); *H01L 25/072* (2013.01); *H01L 24/05* (2013.01); *H01L 24/06* (2013.01); *H01L 2224/0603* (2013.01); *H01L 2224/4846* (2013.01); *H01L 2224/48137* (2013.01); *H01L 2224/48139* (2013.01); *H01L 2224/48227* (2013.01); *H01L 2224/49111* (2013.01); *H01L 2224/49175* (2013.01); *H01L 2224/49431* (2013.01); *H01L 2224/49433* (2013.01); *H01L 2924/00014* (2013.01); *H01L 2924/10161* (2013.01); *H01L 2924/1203* (2013.01); *H01L 2924/13055* (2013.01); *H01L 2924/13091* (2013.01); *H01L 2924/15787* (2013.01); *H01L 2924/19107* (2013.01); *H01L 2924/30107* (2013.01)

(56) References Cited

U.S. PATENT DOCUMENTS

| | | | |
|---|---|---|---|
| 9,773,720 B2 | 9/2017 | Yoshihara et al. | |
| 2002/0024134 A1 | 2/2002 | Arai et al. | |
| 2014/0070269 A1* | 3/2014 | Okamoto | H01L 27/0248 257/140 |
| 2015/0023081 A1* | 1/2015 | Obiraki | H02M 7/003 363/131 |
| 2015/0069463 A1* | 3/2015 | Hartmann | H01L 24/49 257/139 |
| 2015/0221626 A1* | 8/2015 | Motowaki | H01L 24/73 257/712 |

FOREIGN PATENT DOCUMENTS

| | | |
|---|---|---|
| JP | 2011210771 A | 10/2011 |
| WO | 2004073065 A1 | 8/2004 |
| WO | 2014014012 A1 | 1/2014 |
| WO | 2015053219 A1 | 4/2015 |

OTHER PUBLICATIONS

European Patent Office, Extended Search Report issued in corresponding Application No. 15192123.6, dated May 19, 2016, 9 pp.

* cited by examiner

SEMICONDUCTOR MODULE

FIELD OF THE INVENTION

The invention relates to the field of packaging several semiconductor chips into a module. In particular, the invention relates to a semiconductor module.

BACKGROUND OF THE INVENTION

In IGBT power semiconductor modules, typically several IGBT chips and free-wheeling diode chips are connected in parallel to reach the desired module current rating. The gate signal for switching the IGBTs is fed from the outer gate terminals of the semiconductor module to each IGBT chip. In this gate current path, the signal may be distorted during turn-on of the IGBTs. This distortion may lead to certain IGBTs switching slower compared to others. Such a current imbalance may be undesired and may especially reduce the short circuit safe operating area of the semiconductor module.

To produce a low distortion, it is possible to arrange the semiconductor switches side by side in a symmetric way such that the emitter current paths and the gate current paths, respectively, are substantially all of the same length.

US 2002/0024134 A1 shows a semiconductor module, wherein gate electrodes are connected via bond wires with a wiring pattern in a symmetric way.

In WO 2015/053219 A1 and CN 203553127 U generic semiconductor modules are disclosed.

DESCRIPTION OF THE INVENTION

A symmetric arrangement of chips may result in a bad temperature distribution within the semiconductor module. The semiconductor switch chips as well as the diode chips are all concentrated on specific areas on the substrate plate.

When the chips are distributed more homogeneously over the semiconductor module, this may result in a better temperature distribution. However, in this case, some semiconductor switches may have a longer emitter current path than others. Different inductive voltage drops in these paths may cause current imbalances within the semiconductor module.

It is an objective of the invention to provide a semiconductor module with good thermal behavior and well balanced electro-magnetic coupling behavior.

This objective is achieved by the subject-matter of the independent claims. Further exemplary embodiments are evident from the dependent claims and the following description.

The invention relates to a semiconductor module, which, for example, may be a power semiconductor module, which may be adapted for processing currents of more than 100 A and/or 1.000 V.

According to an embodiment of the invention, the semiconductor module comprises a substrate plate, a semiconductor switch chip and a diode chip attached to a collector conductor on the substrate plate, wherein the diode chip is electrically connected antiparallel to the semiconductor switch chip; wherein the semiconductor switch chip (and in particular its emitter electrode) is electrically connected via bond wires to an emitter conductor on the substrate plate providing a first emitter current path. The emitter conductor is arranged oppositely to the semiconductor switch chip with respect to the diode chip. In other words, the diode chip may be arranged between the emitter conductor and the semiconductor switch chip.

A gate electrode of the semiconductor switch chip is electrically connected via a bond wire to a gate conductor on the substrate plate providing a gate current path, which gate conductor is arranged oppositely to the semiconductor switch chip with respect to the diode chip. In other words, the diode chip may be arranged between the gate conductor and the semiconductor switch chip.

A protruding area of the emitter conductor runs and/or is arranged besides the diode chip towards the first semiconductor switch chip and the first semiconductor switch chip is directly connected via a bond wire with the protruding area providing an additional emitter current path running at least partially along the gate current path.

The substrate plate may comprise an electrically not conducting substrate (for example a ceramics substrate) and a metallization layer in which conductors (such as the collector conductor) are formed, to which the chips are connected. The semiconductor switch chip may be connected and/or bonded via a collector electrode to the collector conductor. The substrate plate may be provided on a metallic base plate, which, for example, may be used for cooling the substrate plate.

The semiconductor switch chip may be electrically connected by more than 4, for example more than 10 bond wires to the emitter conductor. The gate electrode may be electrically connected via only one or two bond wires to the gate conductor. The first semiconductor switch chip may be directly connected via only one or two bond wires with the protruding area.

A semiconductor switch chip may be a semiconductor chip carrying and/or providing a semiconductor switch, which is controllable with a gate signal. The diode chip may provide a freewheeling diode for the semiconductor switch chip. The emitter conductor may provide an emitter connection of the semiconductor module. The collector conductor may provide a collector connection of the semiconductor module.

The gate electrode may be arranged on the same side of the semiconductor switch chip as an emitter electrode of the semiconductor switch chip and/or may be connected via one or more bond wires with the gate conductor. The gate conductor, which also may be made from a metallization layer on the substrate, may be arranged on the same side as the emitter conductor. The gate conductor may provide a gate connection for the semiconductor module.

The semiconductor switch chip (and particular its emitter electrode) may be directly connected via one or more bond wires with the protruding area. In such a way, an additional emitter current path between the emitter conductor and the semiconductor switch chip is formed, which may inductively couple with a bond wire interconnecting the gate electrode of the semiconductor switch chip and the gate conductor. This inductive coupling may lower the voltage drop at the gate of the semiconductor switch chip. In such way, the switching behaviour and/or the switching speed of the semiconductor switch may be set and/or adapted with the additional emitter current path.

For example, it may be possible that a second semiconductor switch chip with a different, second gate current path may be arranged in the semiconductor module. The (first) semiconductor switch chip may have a longer gate current path as the second semiconductor switch chip and the voltage drops of the two semiconductor switch chips may be more equal due to the additional emitter current path.

It has to be understood that the collector conductor, the emitter conductor and the gate conductor may be one-piece or may comprise several areas, which are disconnected on the substrate plate, but which may be electrically interconnected with bond wires. For example, the protruding area of the emitter conductor may be one-piece with the rest of the emitter conductor. The collector conductor, the emitter conductor and/or the gate conductor may have a thickness of more than 0.1 mm.

Furthermore, it has to be understood that current paths may be provided by bond wires in combination with conductors on the substrate plate. For example, the gate current path may be provided by one or more bond wires and (at least a part of) the gate conductor. The first emitter current path may be provided by bond wires connected to the emitter electrode and (at least a part of) the emitter conductor. The additional emitter current path may be provided by one or more bond wires, the protruding area to which these bond wires are connected and (at least a part of) the emitter conductor.

According to an embodiment of the invention, the additional emitter current path and the gate current path are arranged such that they are inductively coupled in a way that a gate-emitter voltage of the semiconductor switch chip is raised by a current in the additional emitter path.

The gate-emitter voltage then may equal a gate-emitter voltage of a second semiconductor switch chip. Here, the term "equal" may mean that the gate-emitter voltages do not differ with respect to each other by more than 10% (or even more than 5%).

The inductive coupling may be achieved between a bond wire interconnected with the gate electrode of the semiconductor switch chip and a bond wire interconnecting the emitter electrode with the protruding area of the emitter conductor. These bond wires may run substantially parallel with respect to each other and/or may be as close to each other that the desired inductive coupling is achieved.

According to an embodiment of the invention, a gate electrode of the semiconductor switch chip is connected via a bond wire with a bridging conductor on the substrate plate, which is at least partially surrounded by the protruding area of the emitter conductor and which is connected via a bond wire with the gate conductor. The bridging conductor may be seen as a conductor island, which may be provided by a metallization layer on the substrate of the substrate plate. For example, a part of the metallization layer providing the protruding area may be disconnected from the protruding area and used as bridging conductor. With the bridging conductor, the direction of a bond wire connecting the bridging conductor and the gate electrode of the semiconductor switch chip with respect to a bond wire connecting the protruding area of the emitter conductor with the emitter electrode of the first semiconductor switch chip, may be adjusted more easily. Thus, the inductive coupling between the gate current path and the additional emitter current path may be adjusted more easily.

According to an embodiment of the invention, the bridging conductor is arranged between the diode chip and the protruding area of the emitter conductor. It may be possible that the bridging conductor is positioned directly besides the diode chip. However, it also may be possible that the protruding area of the emitter conductor completely surrounds the bridging conductor. i.e. that the bridging conductor is separated from the first diode chip via a part of the protruding area of the emitter conductor.

According to an embodiment of the invention, the gate electrode of the semiconductor switch chip is provided at a gate electrode side of the semiconductor switch chip and the semiconductor switch chip is positioned such that its gate electrode side points towards diode chip, for example to a side of the semiconductor module with the emitter conductor. The gate electrode (which may be much smaller than the emitter electrode) may be provided at an edge of the semiconductor switch chip. The semiconductor switch chip may be positioned in such a way, that this edge is at the side of the semiconductor switch chip, which is nearer to the gate electrode as the other side. In such a way, the corresponding gate current path may be shortened.

According to an embodiment of the invention, the protruding area of the emitter conductor only runs besides the diode chip. For example, the emitter conductor and in particular the protruding area may end before a (thought line) that is defined by the parallel running edges of the semiconductor switch chip and the diode chip.

According to an embodiment of the invention, the protruding area of the emitter conductor also runs besides the semiconductor switch chip. In this case, the emitter conductor and in particular the protruding area may pass beyond the above mentioned line. In this case, one or more bond wires providing the additional emitter current path may be arranged with a steeper angle with respect to the bond wires of the first gate current path and/or first emitter current path.

According to an embodiment of the invention, the gate conductor is surrounded by the emitter conductor. For example, the gate conductor may comprise one or more islands of metallization layer that are provided inside the metallization layer of the emitter conductor.

According to an embodiment of the invention, the semiconductor switch chip is an IGBT and/or a MOSFET. An IGBT chip may have a collector electrode on one side and an emitter electrode as well as a gate electrode on the opposite side.

A MOSFET chip may have a source electrode on one side and a drain electrode as well as a gate electrode on the opposite side. For MOSFET chips, the emitter also may be called source and the collector also may be called drain. Analogously, the emitter conductor may be seen as a source conductor, the collector conductor may be seen as drain conductor, the emitter current path may be seen as source current path, etc.

According to the invention, the semiconductor switch chip is a first semiconductor switch chip and the diode chip is a first diode chip, which are arranged in a first row; wherein the semiconductor module comprises further a second row of a second semiconductor switch chip and a second diode chip attached to the collector conductor, wherein the diode chip of each row is electrically connected antiparallel to the semiconductor switch chip of the same row and the first and second rows are electrically connected in parallel; wherein the first semiconductor switch chip is arranged besides the second diode chip and the second semiconductor chip is arranged besides the first diode chip; wherein the first and second semiconductor switch chips are electrically connected via bond wires to the emitter conductor on the substrate plate; wherein the emitter conductor is arranged on a side of the semiconductor module besides the first diode chip and the second semiconductor switch chip; wherein gate electrodes of the first and second semiconductor switch chips are electrically connected to the gate conductor, which gate conductor is arranged at the side of the semiconductor module at which the emitter conductor is arranged, such that the first gate current path between the gate electrode of the first semiconductor switch chip and the gate conductor is longer than a second gate current path between the gate electrode of the second semiconductor switch chip and the gate conductor.

The parallelization of the semiconductor switch chips and the rows of chips, respectively, may advantageously provide a higher current rating than a row alone. All chips may be bonded to the collector conductor, which also may provide a collector connection of the semiconductor module. With the above described arrangement, no semiconductor switch chip has to be placed directly besides another semiconductor switch chip. This may provide a better thermal behavior of the semiconductor module. On the other hand, due to the additional emitter current path, the switching behaviour of the first and second semiconductor switch chips may be adapted to each other.

The semiconductor switch chips (as well as the diode chips) may be equally designed and/or may have a substantially rectangular shape.

The first semiconductor switch chip may be connected via the first emitter current path with the emitter conductor (which may be provided by bond wires) and the second semiconductor switch chip may be connected via a different, second emitter current path with the emitter conductor (which also may be provided by bond wires). In other words, the emitter electrodes of the semiconductor switch chips may not be directly interconnected but only may be interconnected via the emitter conductor.

According to an embodiment of the invention, the first semiconductor switch chip is connected via bond wires with the diode chip of the first row and the diode chip of the first row is connected via bond wires with the emitter conductor and/or the diode chip of the second row is connected via bond wires with the second semiconductor switch chip and the second semiconductor switch chip is connected via bond wires with the emitter conductor. The combination of semiconductor switch chip and diode chip of each row may be interconnected with each other and with the emitter conductor via a plurality of bond wires that run substantially parallel to the row. In such a way, two separate emitter current paths may be provided.

According to an embodiment of the invention, a gate electrode of the second semiconductor switch chip is directly connected via a bond wire to the gate conductor. The second semiconductor switch chip, which is directly positioned besides the emitter electrode and/or which gate electrode is nearer to the gate conductor as the gate electrode of the first semiconductor switch chip, may have a shorter gate current path as the first semiconductor switch chip.

According to an embodiment of the invention, the additional emitter current path and the first gate current path are arranged such they are inductively coupled in a way that the gate-emitter voltage of the first semiconductor switch chip equals a gate-emitter voltage of the second semiconductor switch chip. With a higher inductance in the first gate current path than in the second gate current path, the voltage drop between the gate and the emitter of the first semiconductor switch chip may be smaller than between the gate and the emitter of the first semiconductor switch chip. However, when the additional emitter current path and the first gate current path are inductively coupled, a rise in the emitter current of the first semiconductor switch chip (caused by a gate-emitter voltage drop at the first semiconductor switch chip) may cause an additional voltage in the first gate-emitter path. This additional voltage may rise the gate-voltage drop.

According to an embodiment of the invention, the semiconductor module further comprises at least three rows of a semiconductor switch chip and a diode chip, which are connected in parallel. A third row may be arranged besides the second row and the semiconductor switch chips and the diode chips of the second row and third row are arranged side by side. Thus, three switch chip-diode chip-combinations may be arranged side by side. This may provide an even higher current rating.

According to an embodiment of the invention, the semiconductor module further comprises two halves with paralleled semiconductor switches, wherein each halve comprises at least two rows of a semiconductor switch chip and a diode chip. Each half may be designed with the two or more rows of chips as described in the above and in the below. The halves of the semiconductor module may be nearly equally designed and/or may be interconnected to form a half-bridge. In particular, the arrangement of the chips and the gate current paths may be equal. In such a way, the collector conductor of the one half may be interconnected with the emitter conductor of the other half, for providing an AC connection of the semiconductor module.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
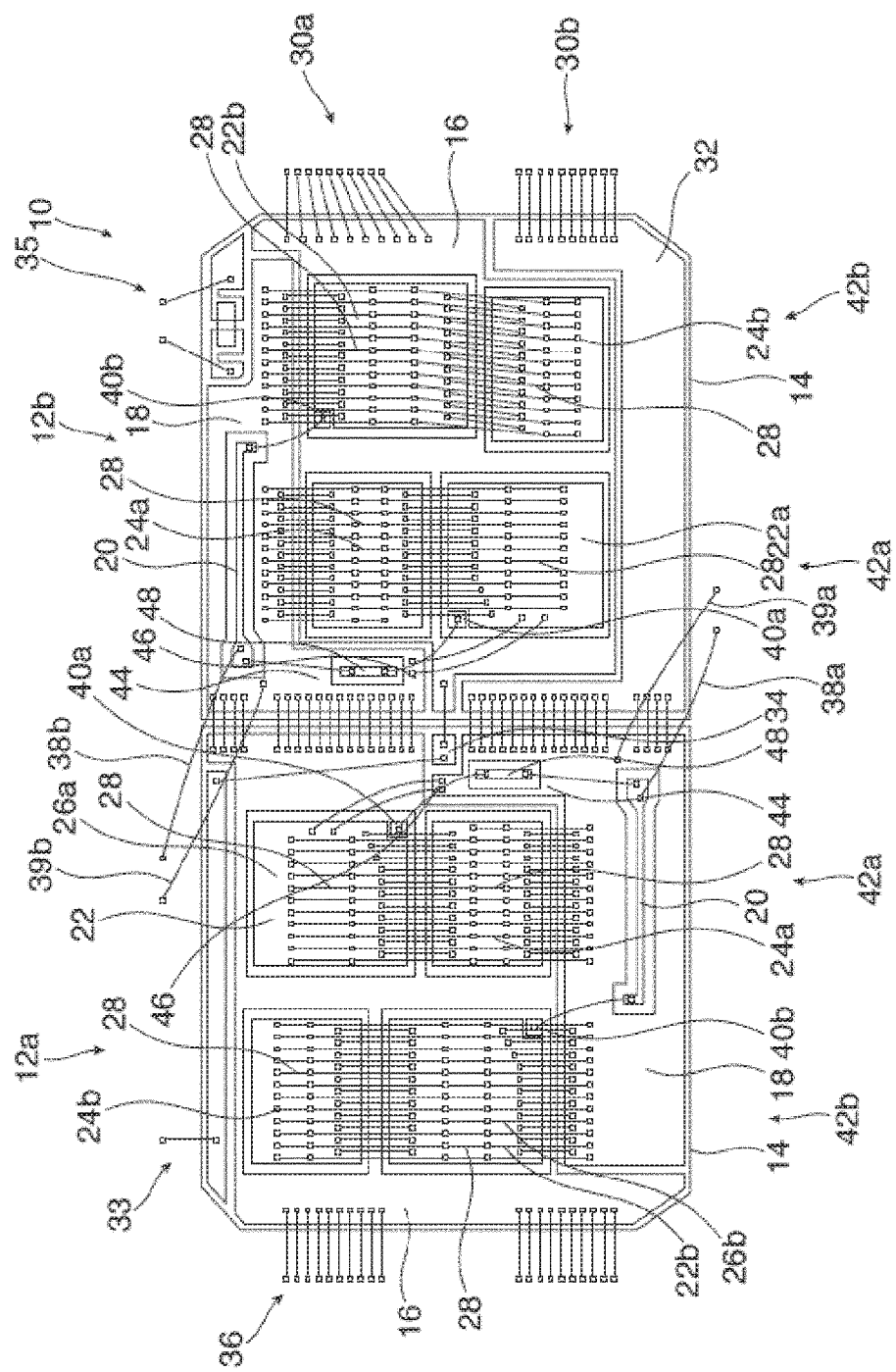
FIG. 1 shows a view from above onto a semiconductor module according to an embodiment of the invention.

FIG. 1 shows a power semiconductor module 10 from above. The power semiconductor module 10 has two nearly equally designed halves 12a, 12b, wherein the equally designed parts may be substantially rotationally symmetric by a rotation about 180° with respect to each other.

Each half 12a, 12b comprises a substrate plate 14, on which a collector conductor 16, an emitter conductor 18 and a gate conductor 20 are provided. All conductors 16, 18, 20 may be made from a metallization layer provided on a substrate of the substrate plate 14.

A plurality of semiconductor chips, i.e. semiconductor switch chips 22a, 22b and diode chips 24a, 24b are bonded to the collector conductor 16. The semiconductor switch chips 22a, 22b are bonded with a collector electrode to the collector layer 16. For example, the semiconductor switch chips 22a, 22b may be IGBTs and/or MOSFETs.

Furthermore, emitter electrodes 26a, 26b of the semiconductor switch chips 22a, 22b and the other sides of the diodes 24a, 24b are interconnected via bond wires 28 to the emitter conductor 18. Each semiconductor switch chips 22a, 22b comprises a gate electrode 40a, 40b, which is provided on the same side as the emitter electrode 26a, 26b. The gate electrode 40a, 40b of each semiconductor switch chip 22a, 22b is connected via a bond wire 28 with the gate conductor 20.

Both the semiconductor switch chips 22a, 22b and the diode chips 24a, 24b have a rectangular shape and have the same width. The first semiconductor switch chip 22a and the first diode chip 24a are arranged in a first row 42a and the second semiconductor switch chip 22b and the second diode chip 24b are arranged in a second row 42b.

The diode chip 24a, 24b of each row 42a, 42b is electrically connected antiparallel to the semiconductor switch chip 22a, 22b of the same row and the rows 42a, 42b are electrically connected in parallel via the collector conductor 16 and the emitter conductor 18. In summary, each half 12a, 12b forms an electrical switch comprising two paralleled semiconductor switch chips 22a, 22b, each of which comprises a freewheeling diode provided by the diode chip 24a, 24b.

Both halves 12a, 12b of the semiconductor module 10 are interconnected to form a half bridge. The collector conductor 16 of the second half 12b provides a DC+ connection 30a of the semiconductor module 10 and a DC− connection 30b on a DC− conductor 32 on the substrate plate arranged oppositely to the emitter conductor 18 and the gate conductor 20. The DC− conductor 32 is connected via bond wires 28 with the emitter conductor 18 of the first half 12a.

An auxiliary DC+ connection 33 is provided oppositely to the emitter conductor 18 and the gate conductor 20 of the first half 12a, which DC+ connection 33 is connected via a bond wire 28 to a DC+ bridging conductor 34 on the first half 12a besides the tip 46 of the protruding area 44. The DC+ bridging conductor 34 is connected via a further bond wire 28 with the collector conductor 16 of the second half 12b.

Furthermore, on the second half 12b, a temperature sensor 35 is provided.

The collector conductor 16 of the first half 12a provides an AC connection 36 of the semiconductor module 10. The AC connection 36 is provided oppositely to the DC+ connection 30a and the DC− connection 30b.

Furthermore, on the side of the gate conductor 20 of the first half 12a, a low side gate connection 38a is provided by a bond wire 28 connected to the gate conductor 20. Here, also a low side emitter connection 39a is provided by a bond wire 28 connected to the emitter conductor 20 of the first half 12a. On the side of the gate conductor 20 of the second half 12b, a high side gate connection 38b is provided by a bond wire 28 connected to the gate conductor 20. Here, also a high side emitter connection 39b is provided by a bond wire 28 connected to the emitter conductor 20 of the second half 12b.

The order of the chips 22a, 24a/22b, 24b in each row 42a, 42b is reversed with respect to each other. The first semiconductor switch chip 22a is arranged besides the second diode chip 24b and the second semiconductor switch chip 22b is arranged besides the first diode chip 24a. In such a way, a thermal coupling of the chips 22a, 24a, 22b, 24b with the substrate plate 14 is optimized, since the semiconductor switch chips 22a are distributed uniformly on the substrate plate 14.

The emitter conductor 18 and the gate conductor 20 are arranged on the same side of the semiconductor module 10. The emitter conductor 18 is arranged besides the first diode chip 24a and the second semiconductor switch chip 22b.

It may be defined that the rows 42a, 42b are running along a row direction. In this case, the emitter conductor 18 and the gate conductor 20 may run substantially orthogonal to the row direction. Furthermore, the bond wires 28 interconnecting the emitter electrodes 26a, 26b with the respective diodes of the same row and/or the bond wires 28 interconnecting the emitter electrode 26a, 26b with the emitter conductor 18 and/or the bond wires 28 interconnecting the diode chip 24a, 24b with the emitter conductor 18 may run substantially parallel to the row direction.

The gate conductor 20 of FIG. 1 is one-piece and is completely surrounded by the emitter conductor (in the plane of the metallization layer). Also the collector conductor 16 and the emitter conductor 18 are one-piece.

The emitter conductor has a protruding area 44, which is arranged directly besides the first row 42a and/or which protrudes along the row direction. The tip 46 of the protruding area is connected via two bond wires 28 with the emitter area 26a of the first semiconductor switch chip 22a. In FIG. 1, with respect to the row direction, the protruding area 44 (and in particular its tip 46) ends before the semiconductor switch chip 22a.

In the protruding area 44, besides the diode chip 24a, a bridging conductor 48 is arranged, which is used to interconnect the first gate electrode 40a with the gate conductor 20. In particular, a bond wire 28 interconnects the first gate electrode 40a with the bridging conductor 48 and a further bond wire 28 interconnects the bridging conductor 48 with the gate conductor 20.

Figure 2:
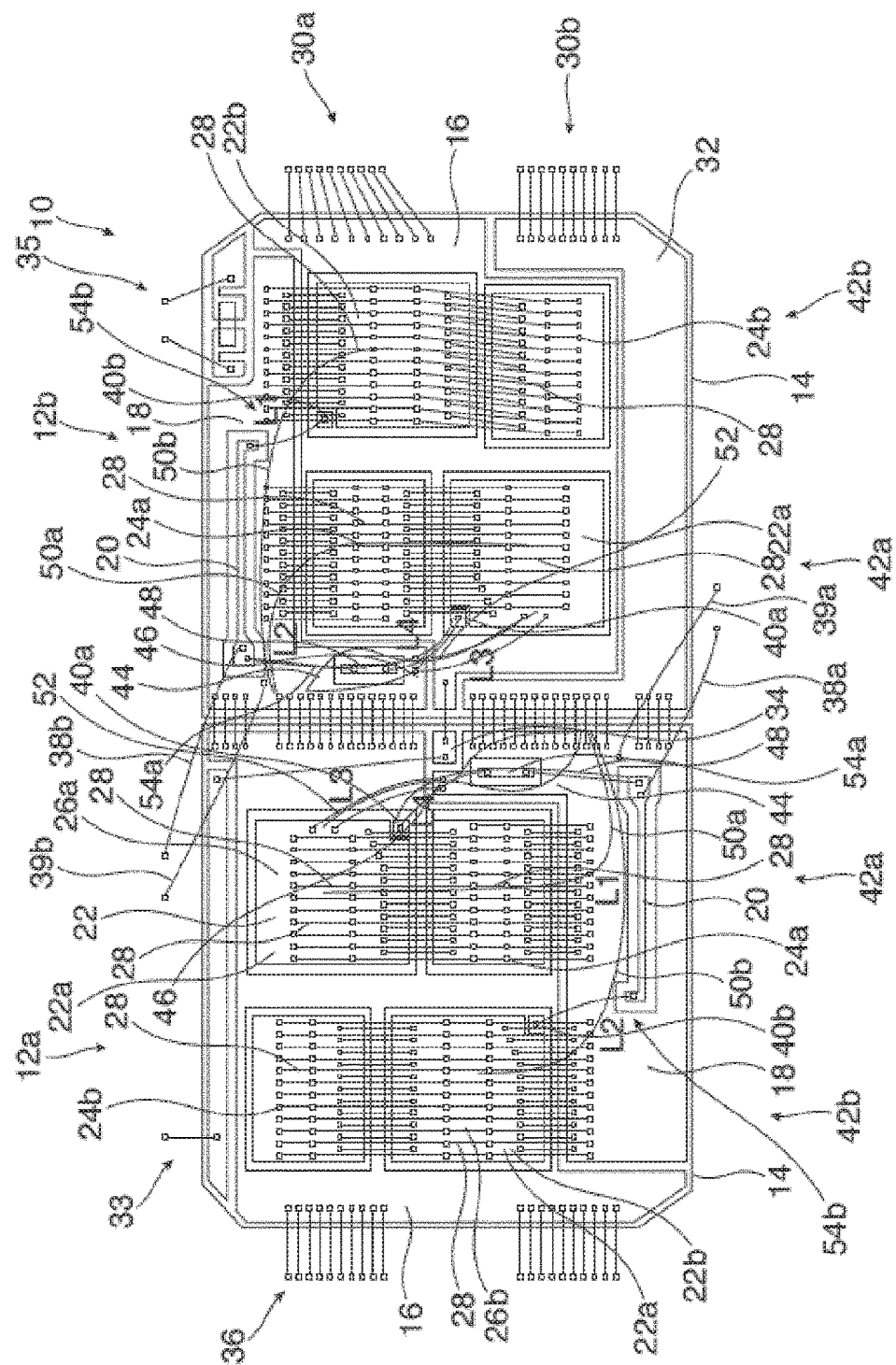
FIG. 2 shows a view from above onto the semiconductor module of FIG. 1 with inductive paths.

FIG. 2 shows additionally specific current paths in the module 10. A first emitter current path 50a with inductance L1 is provided by the emitter conductor 18 and the bond wires 28 interconnecting the emitter conductor 18 via the first diode chip 24a with the emitter electrode 26a of the first semiconductor switch chip 22a. A second emitter current path 50b with inductance L2 is provided by the emitter conductor 18 and the bond wires 28 interconnecting the emitter conductor 18 directly with the emitter electrode 26b of the second semiconductor switch chip 22b. Geometrically seen, the first emitter current path 50a is longer than the second emitter current path 50b.

Furthermore, there is an additional emitter current path 52 with inductance L3 for the first semiconductor switch chip 22a, which is provided by the emitter conductor 18, the protruding area 44 and the bond wire 28 interconnecting the protruding area 44 with the emitter electrode 26a.

A first gate current path 54a with inductance L4 is provided by the gate conductor 20 and the bond wire 28 interconnecting the gate conductor 20 with the first gate electrode 40a. A second gate current path 54b, which is longer than the first gate current path 54a, is provided by the gate conductor 20 and the bond wire 28 interconnecting the gate conductor 20 with the second gate electrode 40b.

Figure 3:
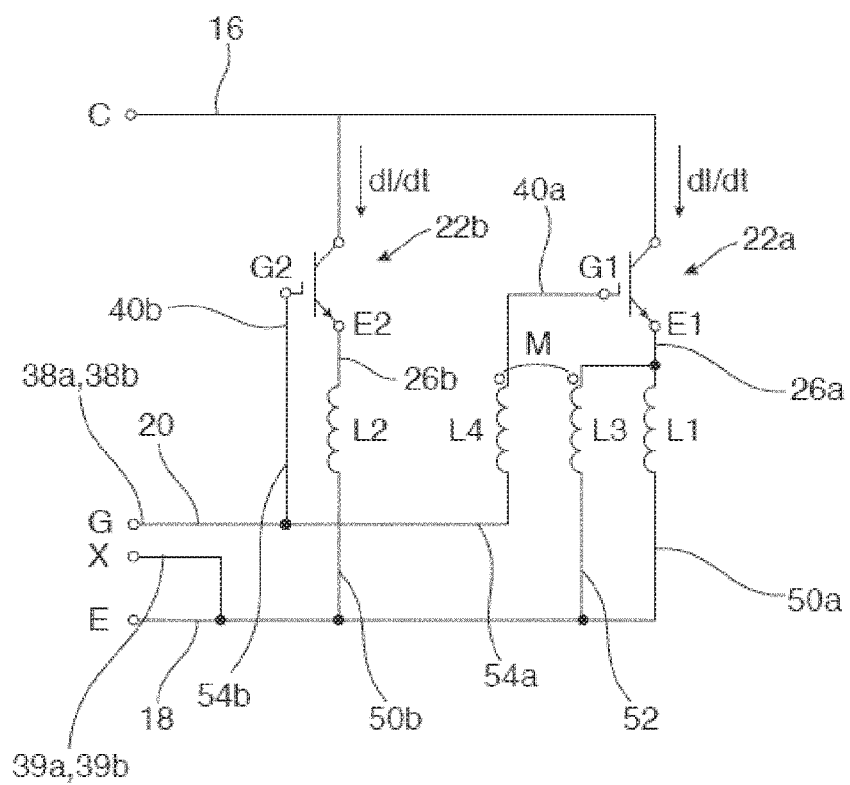
FIG. 3 schematically shows a circuit diagram of the semiconductor module of FIGS. 1 and 2.

FIG. 3 shows a circuit diagram for one half 12a, 12b of the semiconductor module 10. In the following, let C be the connection point of the collector conductor, E the connection point of the emitter conductor 18, G the low side or high side connection 38a, 38b of the gate conductor 20 and X the low side or high side emitter connection 39a, 39b. E1 and G1 are the emitter and gate of the first semiconductor switch chip 22a and E2 and G2 the emitter and gate of the second semiconductor switch chip 22b.

The current flows from the connection point C via the collector conductor 16 through the semiconductor switch chips 22a, 22b, to the emitters E1, E2 and via the current paths 50a, 50b, 52 to the connection point E. Between the connection points G and X, a control voltage V(G-X) is applied which is fed to semiconductor switch chips 22a, 22b. During turn-on of the semiconductor switch chips 22a, 22b, the current rises with a current slope dI/dt. This current slope leads to an inductive voltage drop along the power conductors. The inductances are indicated with L1 and L2 for the emitter current paths 50a, 50b. Ideally, L1 and L2 should be identical but typically they are not.

When one assumes that L3=L4=0 and L1 is different from L2, the voltage drop is not the same for the two semiconductor switch chips 22a, 22b:

$$V(E1-X) = L1 * \frac{dI}{dt}$$

$$V(E2-X) = L2 * \frac{dI}{dt}$$

The difference in voltage drop will then cause a difference in the control signal that is applied to the two semiconductor switch chips 22a, 22b:

$$V(G1-E1) = V(G-X) - L1 \cdot \frac{dI}{dt}$$

$$V(G2-E2) = V(G-X) - L2 \cdot \frac{dI}{dt}$$

As a consequence, this difference in gate-emitter voltage will lead to a difference in the current and the current slope of the two semiconductor switch chips 22a, 22b.

To render the two voltage drops more equal, for the semiconductor switch chip 22a with the higher emitter path inductance L1, an additional emitter current path 52 is introduced that is inductively coupled with the first gate current path 54a.

As shown in FIGS. 1 and 2, the coupling may be achieved by arranging the conductors of the both paths substantially parallel and/or closely follow each other. These conductors are the protruding area 44 and the bond wires 28 connected to the emitter electrode 26a for the additional emitter current path 52 and the bridging conductor 48 as well as the bond wires 28 connected thereto for the first gate current path 54a. The bridging conductor 48 may help for arranging the conductors substantially parallel and/or in such a way that the desired inductive coupling may be achieved. By the gate current path 54a closely following the additional current emitter path 52, high mutual coupling may be obtained.

Let L3 by the inductance of the additional emitter current path, L4 the inductance of the first gate current path and M their mutual inductance. A voltage dropping the additional emitter current path 52 will induce voltage in the first gate current path 54 and thus will lift the gate-emitter voltage for the semiconductor switch chip 22a. This can be used to equalize the coupling between the two semiconductor switch chips 22a, 22b.

The voltage induced in the first gate current path 54a (L2 and L3 electrically connected in parallel):

$$V(E1-X) = \frac{(L3 \cdot L1)}{L3+L1} \cdot \frac{dI}{dt}$$

The dI/dt flowing through L3 is:

$$\frac{dI3}{dt} = \frac{L1}{L3+L1} \cdot \frac{dI}{dt}$$

This dI/dt is coupling into the first gate current path 54a via the mutual inductance M:

$$V(G1-G) = \frac{M \cdot L1}{L3+L1} \cdot \frac{dI}{dt}$$

The resulting gate-emitter voltage of the first semiconductor switch chip 22a is:

$$V(G1-E1) = V(G-X) + V(G1-G) - V(E1-X)$$
$$= V(G-X) + \frac{M \cdot L1}{L3+L1} \cdot \frac{dI}{dt} - \frac{(L3 \cdot L1)}{L3+L1} \cdot \frac{dI}{dt}$$
$$= V(G-X) + \frac{(M-L3) \cdot L1}{L3+L1} \cdot \frac{dI}{dt}$$

The gate-emitter voltage of the second semiconductor switch chip 22b is unchanged:

$$V(G2-E2) = V(G-X) - L2 \cdot \frac{dI}{dt}$$

By adjusting the mutual coupling, the induced gate-emitter voltages can be equalized:

$$V(G2-E2) = V(G1-E1)$$
$$V(G-X) - L2 \cdot \frac{dI}{dt} = V(G-X) + \frac{(M-L3) \cdot L1}{L3+L1} \cdot \frac{dI}{dt}$$
$$-L2 = \frac{(M-L3) \cdot L1}{L3+L1}$$
$$-L2(L3+L1) = (M-L3) \cdot L1$$
$$L3 \cdot L1 - L2(L3+L1) = M \cdot L1$$
$$M = L3 - \frac{L2(L3+L1)}{L1}$$

For the following example values, the gate-emitter coupling is in equilibrium:

L1=1 nH, L2=2 nH, L3=10 nH, M=4 nH

Figure 4:
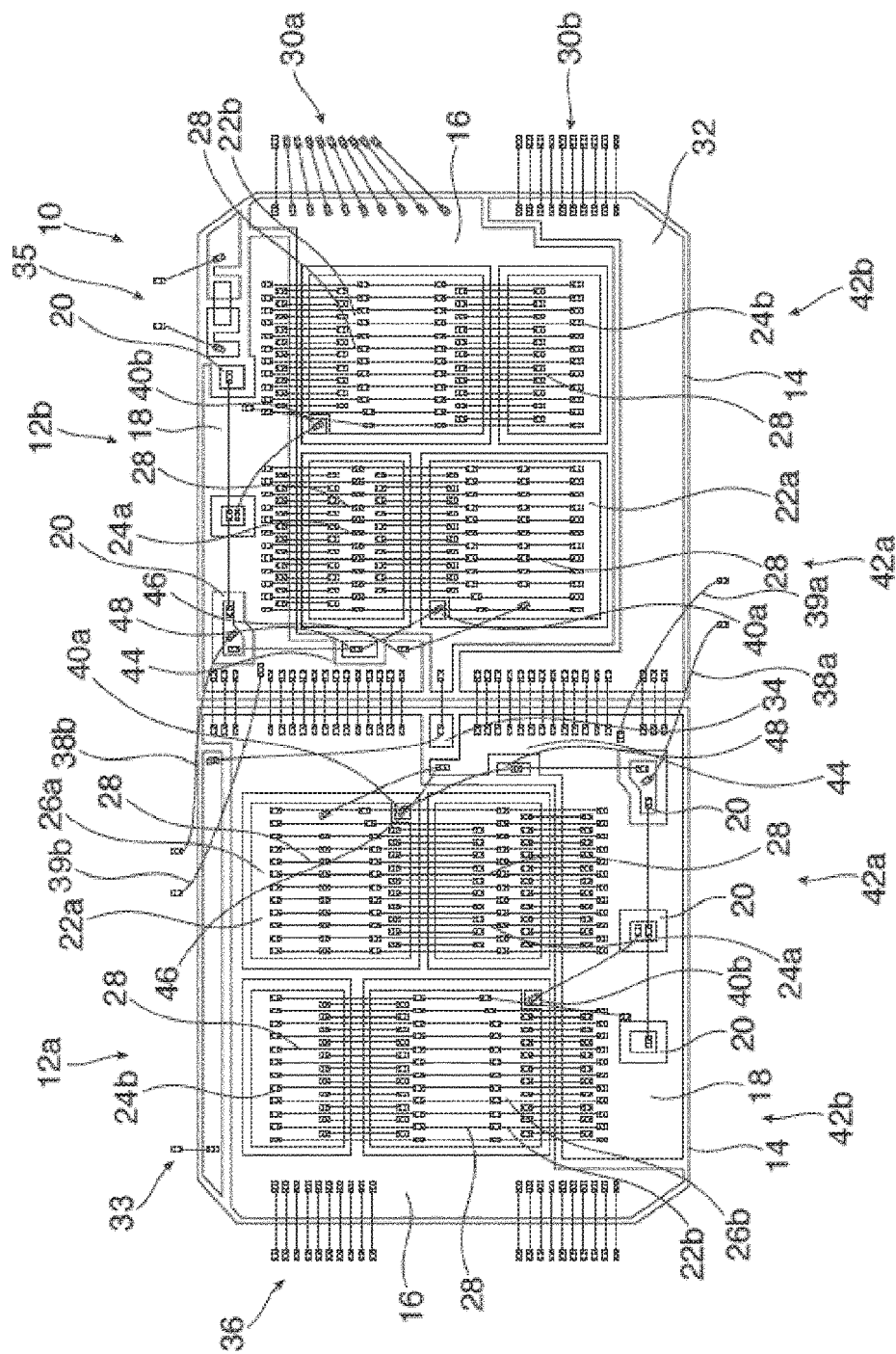
FIG. 4 shows a view from above onto a semiconductor module according to a further embodiment of the invention.

FIG. 4 shows a further embodiment of a semiconductor module 10. The design of FIG. 2 is nearly equal to the design of FIG. 1. However, the gate conductor 20, the emitter conductor 18, the protruding area 44 and the bridging area 48 are different.

Contrary to FIG. 1, the gate electrode 20 is not one-piece, but comprises several islands in the emitter conductor 18, which are interconnected by wire bonds 28.

Furthermore, the bridging area 48 is arranged directly besides the first diode chip 24a. In such a way, the protruding area 44 and/or the additional emitter current path 52 does not have a hole and/or two branches, but only has one branch.

As in FIG. 1, the additional emitter current path 52 may comprise one, two or more bond wires 28 from the bridging area 48 to the emitter electrode 26a.

Figure 5:
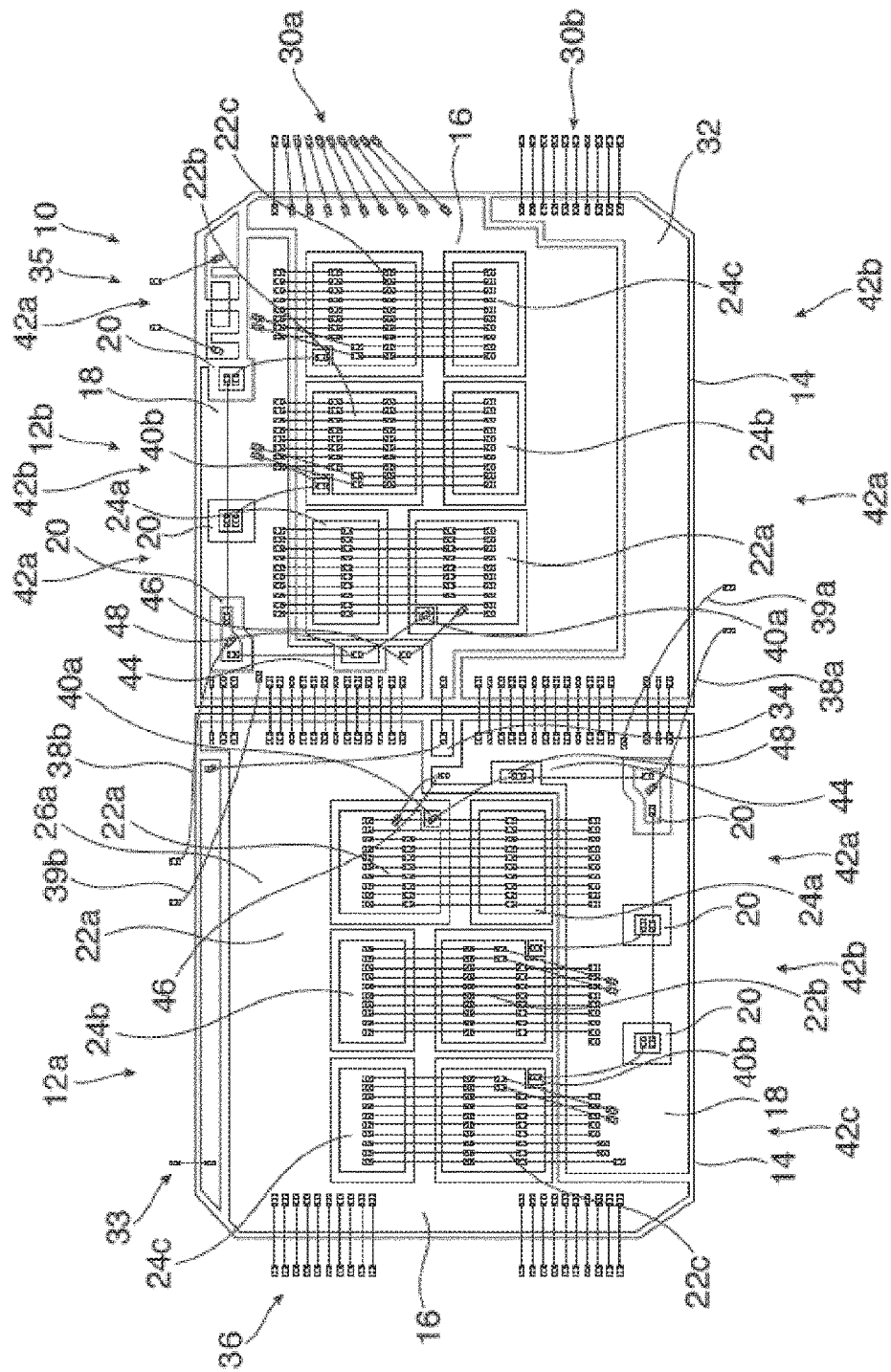
FIG. 5 shows a view from above onto a semiconductor module according to a further embodiment of the invention.

FIG. 5 shows a further embodiment of a semiconductor module 10, wherein each half 12a, 12b comprises three rows 42a, 42b, 42c of chips to achieve an even higher current rating. The third row 42c may be arranged besides the second row 42b and/or may be equally designed as the second row 42b.

As in the previous embodiments, the switching behavior of the first semiconductor switch chip 22a is adapted to the switching behavior of the second and third first semiconductor switch chips 22b, 22c by inductively coupling its gate current path with an additional emitter current path. This may be achieved in the same ways as described with respect to the previous embodiments.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 semiconductor module
12a first half of semiconductor module
12b second half of semiconductor module
14 substrate plate
16 collector conductor
18 emitter conductor
20 gate conductor
22a first semiconductor switch chip
22b second semiconductor switch chip
24a first diode chip
24b second diode chip
26a first emitter electrode
26b second emitter electrode
28 bond wire
30a DC+ connection
30b DC− connection
32 DC− conductor
34 DC+ bridging conductor
36 AC connection
38a low side gate connection
38b high side gate connection
39a low side emitter connection
39b high side emitter connection
40a first gate electrode
40b second gate electrode
42a first row
42b second row
44 protruding area
46 tip of protruding area
48 bridging conductor
50a first emitter current path
50b second emitter current path
52 additional emitter current path
54a first gate current path
54b second gate current path
C collector connection point
G gate connection point
E emitter connection point
X auxiliary emitter connection point
G1, G2 gate
E1, E2 emitter
L1 inductance of first emitter current path
L2 inductance of second emitter current path
L3 inductance of additional emitter current path
L4 inductance of first gate current path
22c third semiconductor switch chip
24c third diode chip
42c third row

The invention claimed is:

1. A semiconductor module, comprising:
a substrate plate;
a semiconductor switch chip and a diode chip attached to a collector conductor on the substrate plate, wherein the diode chip is electrically connected antiparallel to the semiconductor switch chip;
wherein the semiconductor switch chip is electrically connected via bond wires to an emitter conductor on the substrate plate providing a first emitter current path, which the emitter conductor is arranged oppositely to the semiconductor switch chip with respect to the diode chip;
wherein a gate electrode of the semiconductor switch chip is electrically connected via a bond wire to a gate conductor on the substrate plate providing a gate current path, which the gate conductor is arranged oppositely to the semiconductor switch chip with respect to the diode chip;
wherein a protruding area of the emitter conductor runs beside the diode chip towards the first semiconductor switch chip and the first semiconductor switch chip is directly connected via a bond wire with the protruding area providing an additional emitter current path running at least partially along the gate current path;
wherein the semiconductor switch chip is a first semiconductor switch chip and the diode chip is a first diode chip, which are arranged in a first row;
wherein the semiconductor module comprises further a second row of a second semiconductor switch chip and a second diode chip attached to the collector conductor, wherein the diode chip of each row is electrically connected antiparallel to the semiconductor switch chip of the same row and the first and second rows are electrically connected in parallel;
wherein the first semiconductor switch chip is arranged beside the second diode chip and the second semiconductor chip is arranged beside the first diode chip;
wherein the first and second semiconductor switch chips are electrically connected via bond wires to the emitter conductor on the substrate plate;
wherein the emitter conductor is arranged on a side of the semiconductor module beside the first diode chip and the second semiconductor switch chip; and
wherein gate electrodes of the first and second semiconductor switch chips are electrically connected to the gate conductor, which the gate conductor is arranged at the side of the semiconductor module at which the emitter conductor is arranged, such that the first gate current path between the gate electrode of the first semiconductor switch chip and the gate conductor is longer than a second gate current path between the gate electrode of the second semiconductor switch chip and the gate conductor.

2. The semiconductor module of claim 1, wherein the additional emitter current path and the gate current path are arranged such that they are inductively coupled in a way, that a gate-emitter voltage of the semiconductor switch chip is raised by a current in the additional emitter current path.

3. The semiconductor module of claim 1, wherein the semiconductor switch chip is connected via bond wires with the diode chip and the diode chip is connected via bond wires with the emitter conductor.

4. The semiconductor module of claim 1, wherein the gate electrode of the semiconductor switch chip is connected via a bond wire with a bridging conductor on the substrate plate, which is at least partially surrounded by the protruding area of the emitter conductor and which is connected via a bond wire with the gate conductor.

5. The semiconductor module of claim 3, wherein the bridging conductor is arranged between the diode chip and the protruding area of the emitter conductor; or
wherein the protruding area of the emitter conductor completely surrounds the bridging conductor.

6. The semiconductor module of claim 1, wherein the gate electrode of the semiconductor switch chip is provided at a gate electrode side of the semiconductor switch chip and wherein the semiconductor switch chip is positioned such that its gate electrode side points towards the diode chip.

7. The semiconductor module of claim 1, wherein the protruding area of the emitter conductor also runs beside the semiconductor switch chip.

8. The semiconductor module of claim 1, wherein the gate conductor is surrounded by the emitter conductor.

9. The semiconductor module of claim 1, wherein the semiconductor switch chip is an IGBTs or an MOSFET.

10. The semiconductor module of claim 1, wherein the second diode chip is connected via bond wires with the second semiconductor switch chip and the second semiconductor switch chip is connected via bond wires with the emitter conductor.

11. The semiconductor module of claim 1, wherein the gate electrode of the second semiconductor switch chip is directly connected via a bond wire to the gate conductor.

12. The semiconductor module of claim 1, wherein the additional emitter current path and the first gate current path are arranged such they are inductively coupled in a way that the gate-emitter voltage of the first semiconductor switch chip equals a gate-emitter voltage of the second semiconductor switch chip.

13. The semiconductor module of claim 1, further comprising:
at least three rows of a semiconductor switch chip and a diode chip, which are connected in parallel;
wherein a third row is arranged beside the second row and the semiconductor switch chips and the diode chips of the second row and third row are arranged side by side.

14. The semiconductor module of claim 1, comprising:
two halves with parallel semiconductor switches;
wherein each halve comprises at least two rows of a semiconductor switch chip and a diode chip;
wherein the halves of the semiconductor module are interconnected to form a half-bridge.

15. The semiconductor module of claim 2, wherein the semiconductor switch chip is connected via bond wires with the diode chip and the diode chip is connected via bond wires with the emitter conductor.

16. The semiconductor module of claim 15, wherein the bridging conductor is arranged between the diode chip and the protruding area of the emitter conductor; or
wherein the protruding area of the emitter conductor completely surrounds the bridging conductor.

17. The semiconductor module of claim 2, wherein the gate electrode of the semiconductor switch chip is connected via a bond wire with a bridging conductor on the substrate plate, which is at least partially surrounded by the protruding area of the emitter conductor and which is connected via a bond wire with the gate conductor.

18. The semiconductor module of claim 3, wherein the gate electrode of the semiconductor switch chip is connected via a bond wire with a bridging conductor on the substrate plate, which is at least partially surrounded by the protruding area of the emitter conductor and which is connected via a bond wire with the gate conductor.

19. The semiconductor module of claim 2, wherein the gate electrode of the semiconductor switch chip is provided at a gate electrode side of the semiconductor switch chip and wherein the semiconductor switch chip is positioned such that its gate electrode side points towards the diode chip.

20. The semiconductor module of claim 3, wherein the gate electrode of the semiconductor switch chip is provided at a gate electrode side of the semiconductor switch chip and wherein the semiconductor switch chip is positioned such that its gate electrode side points towards the diode chip.

21. The semiconductor module of claim 1, wherein the protruding area of the emitter conductor runs beside the diode chip without running beside the semiconductor switch chip.

* * * * *